United States Patent [19]

Gloaguen

[11] Patent Number: 4,864,166

[45] Date of Patent: Sep. 5, 1989

[54] TRI-STATE LOGIC LEVEL CONVERTER CIRCUIT

[75] Inventor: Gilbert Gloaguen, Tourville/Odon, France

[73] Assignee: U.S. Philips Corp., New York, N.Y.

[21] Appl. No.: 312,361

[22] Filed: Feb. 14, 1989

Related U.S. Application Data

[63] Continuation of Ser. No. 59,656, Jun. 8, 1987, abandoned.

[30] Foreign Application Priority Data

Jun. 8, 1986 [FR] France .................. 86 08184

[51] Int. Cl.⁴ .................. H03K 17/16; H03K 19/086; H03K 19/092
[52] U.S. Cl. .................. 307/475; 307/443; 307/455; 307/473; 307/264
[58] Field of Search .............. 307/443, 455, 473, 415, 307/264

[56] References Cited

FOREIGN PATENT DOCUMENTS 0097857 1/1984 European Pat. Off. ............ 307/475
0028528 3/1981 Japan .................................. 307/475

OTHER PUBLICATIONS

IBM Tech. Disc. Bul., "Complementary Driven for Emitter-Coupled-Logic Gates", Chang pp. 4614–4615.

Primary Examiner—Stanley D. Miller
Assistant Examiner—M. R. Wambach
Attorney, Agent, or Firm—Steven R. Biren

[57] ABSTRACT

A logic level converter circuit has a first state ($E_1$ low, $E_2$ low) which produces a high level on the output TTL S, a second state ($E_1$ high, $E_2$ low) which produces a low level on the output S, and a third state ($E_2$ high) which a very high impedance in which the two output transistors $T_5$ and $T_6$ are turned off. The current of a current source $I_1$ is directed by the transistors $T_1$, $T_2$, $T_7$, $T_8$ and $T_9$. In the second state and the third state, a diode $D_3$ which bridges the bases of the transistors $T_5$ and $T_6$ (points A and B) is conductive, while a diode $D_2$, connected between ground and the point A, is conductive in the third state.

6 Claims, 3 Drawing Sheets

TRI-STATE LOGIC LEVEL CONVERTER CIRCUIT

This is a continuation of application Ser. No. 059,656, filed June 8, 1987, now abandoned.

BACKGROUND OF THE INVENTION

The invention relates to a circuit for converting logic levels between logic of the type utilizing pairs of emitter-coupled transistors (ECL, CML) and logic of the transistor-transistor type (TTL), comprising a differential input stage which includes at least one first transistor and one second transistor whose emitters are coupled, and a principal current source which is connected between said coupled emitters, and a negative supply voltage source, their collectors being connected to a positive supply voltage source via a first resistor and a second resistor, respectively, the base of the first transistor being connected to a reference voltage whilst that of the second transistor receives an input signal whose level is to be translated, a first diode and a second diode whose anodes are connected to ground and whose cathodes are connected to the collector of the first transistor and the second transistor, respectively, and also comprising an output stage which includes a fifth transistor and a sixth transistor whose collector-emitter paths are connected in series, the emitter of the fifth transistor being connected to ground, its base being connected to the collector of the first transistor and its collector being connected to the emitter of the sixth transistor at a point which forms the output of the converter circuit, the base of the sixth transistor being connected to the collector of the second transistor whilst its collector is connected to the positive supply voltage source.

A converter circuit of this type has already been produced in cells which are marketed under the name ACE, but this circuit has the drawback that it has only two low-impedance states.

However, there is an increasing need for circuits of this kind which can be arranged with their outputs interconnected in parallel. For such an application it must be possible to set the circuits to a third state in which their output presents a very high impedance, independently of the signals received on their inputs. The parallel-connected circuits are thus used by setting n−1 circuits to the third state, the output of a selected circuit being in the first state or the second state in dependence of the signal received on its logic input.

SUMMARY OF THE INVENTION

It is the object of the invention to provide a converter circuit of the described type which has such a third state without necessitating the addition of a second, supplementary principal current source.

To achieve this, the converter circuit in accordance with the invention is characterized in that it comprises a seventh transistor and an eight transistor whose emitters are coupled and connected to the collector of a ninth transistor whose base is connected to that of the second transistor and whose emitter is connected to the emitters of the first transistor and the second transistor, the base of the seventh transistor receiving said reference voltage and the collector of the seventh transistor being connected to ground, the base of the eighth transistor being connected to the base of a tenth transistor which constitutes a selection input for said third state and whose collector and emitter are connected to ground and to the base of the second transistor, respectively, the collector of the eighth transistor being connected to that of the second transistor, and also comprising a third diode whose anode is connected to the base of the fifth transistor and whose cathode is connected to the collector of the second transistor.

In an alternative embodiment in which the input level can be shifted, the differential input stage comprises a third transistor whose collector is connected to ground, whose base receives said reference voltage and whose emitter is connected to the base of a first transistor, and also comprises a fourth transistor whose base receives directly said input signal, whose emitter is connected to the base of the second transistor, and whose collector is connected to ground, a first and a second auxiliary current source being connected to the emitters of the third transistor and the fourth transistor, respectively.

In a preferred embodiment, said third diode is formed by the base-emitter diode of an eleventh transistor whose base is connected to the base of the fifth transistor and whose collector is connected to the base of the sixxth transistor so that the base of the sixth transistor and the second resistor are connected to the collector of the second transistor via the collector-emitter path of the eleventh transistor.

Thus, given elements of the circuit are isolated from the positive supply voltage, so that the second diode, the second transistor and the eighth transistor need not sustain reverse voltages at the limit of the avalanche voltages of the junctions.

It is also desirable to prevent saturation of the fifth transistor and, as the case may be, of the eleventh transistor.

In a first alternative embodiment, these transistors are Schottky transistors.

In a second alternative embodiment in which the use of Schottky technology is avoided, a third resistor is connected in series between the collector of the first transistor and the first resistor and use is made of a fourth diode and a fifth diode whose anodes are interconnected at the common junction of the first resistor and the third resistor, the cathode of the fourth diode being connected to the output of the converter circuit while that of the fifth diode is connected to the collector of the eleventh transistor, use also being made of a third auxiliary current source which is connected between the collector of the first transistor and the negative supply voltage source, the product of the value of the third resistor and the intensity of the third auxiliary current source being such that saturation of the fifth transistor and the eleventh transistor is avoided.

BRIEF DESCRIPTION OF THE DRAWING

The invention will be better understood on the basis of the following description, given by way of a nonlimitative example, with reference to the drawings, in which.

DESCRIPTION OF THE PREFERRED EMBODIMENTS

Figure 1:
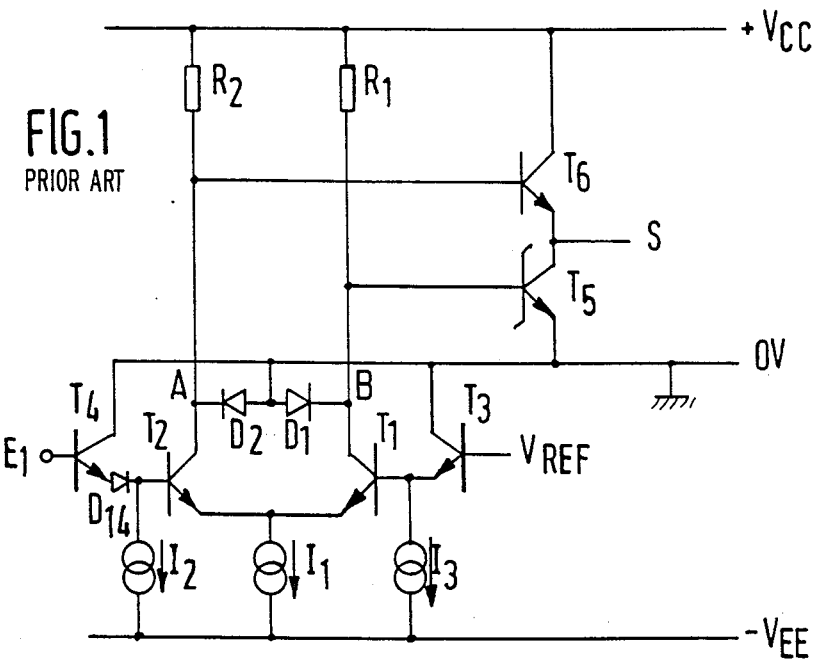
FIG. 1 shows a known converter circuit.

FIG. 1 shows a known two-level converter circuit, comprising a differential stage which includes at least two emitter-coupled transistors $T_1$ and $T_2$ which are connected to a principal current source $I_1$ (supplying a current of, for example 5 mA) which is connected to a negative supply voltage $-VEE$. The collectors of the transistors $T_1$ and $T_2$ are connected to a positive supply voltage $+Vcc$ via resistors $R_1$ and $R_2$, respectively. The cathodes of two diodes $D_1$ and $D_2$ are connected to the collectors of the transistor $T_1$ (point B) and the transistor $T_2$ (point A), respectively, their anodes being connected to ground 0 V. The base of the transistor $T_1$ is to be connected to a reference voltage and that of the transistor $T_2$ is intended to receive input signals.

In the case where a shift of the input level is necessary, the base of the transistor $T_1$ is connected to a transistor $T_3$ which is connected as an emitter-follower, whose base directly receives a reference voltage VREF and whose collector is connected to ground. Similarly, the base of the transistor $T_2$ is driven by a transistor $T_4$ which is connected as an emitter follower, whose base receives directly a logic input signal $E_1$, and whose collector is connected to ground. Auxiliary current sources $I_2$ and $I_3$, each of which supplies a current of, for example 0.5 mA, are connected between the emitters of the transistors $T_4$ and $T_3$, respectively, and the negative supply voltage source $-VEE$. The transistors $T_3$ and $T_4$ enable the input level $E_1$ as well as VREF to be lowered by an emitter-base voltage VBE. As the case may be, a diode $D_{14}$ may also be added in series and directly in the emitter of $T_4$ in order to ensure level compatibility.

The collector-emitter paths of two transistors $T_5$ and $T_6$ are connected in series. The emitter of the transistor $T_5$ is connected to ground OV and its collector is connected to the emitter of the transistor $T_6$ whose collector is connected to the positive supply voltage $+Vcc$. The base of the transistor $T_5$ is connected to the collector of the transistor $T_1$ (point B) and that of the transistor $T_6$ is connected to the collector of the transistor $T_2$ (point A).

The input $E_1$ receives signals of logic of the type utilizing pairs of emitter-coupled transistor (ECL, CML) and the common junction of the emitter of the transistor $T_6$ and the collector of the transistor $T_5$ forms the output S of the converter in transistor-transistor logic (TTL).

When $E_1$ carries the high level, the transistors $T_4$ and $T_2$ are turned on and the current $I_1$ flows through the resistor $R_2$ and the diode $D_2$. The conductive diode $D_2$ fixes the potential of the point A at $-VBE$, VBE denoting a base-emitter voltage of a transistor (approximately 0.7 V). The transistor $T_6$ is turned off and the transistor $T_5$ is turned on. Thus, the output S carries the low level with a low output impedance. When $E_1$ is low, the transistor $T_3$ and $T_1$ are turned on and the current $I_1$ flows through the transistor $T_1$ and the diode $D_1$. The conductive diode $D_1$ fixes the potential of the point B at $-VBE$. The transistor $T_5$ is turned off and the transistor $T_6$ is turned on. The output S thus carries the high level $Vcc-VBE(T_6)$ with a low output impedance, VBE ($T_6$) denoting the base-emitter voltage of the transistor $T_6$.

Figure 2:
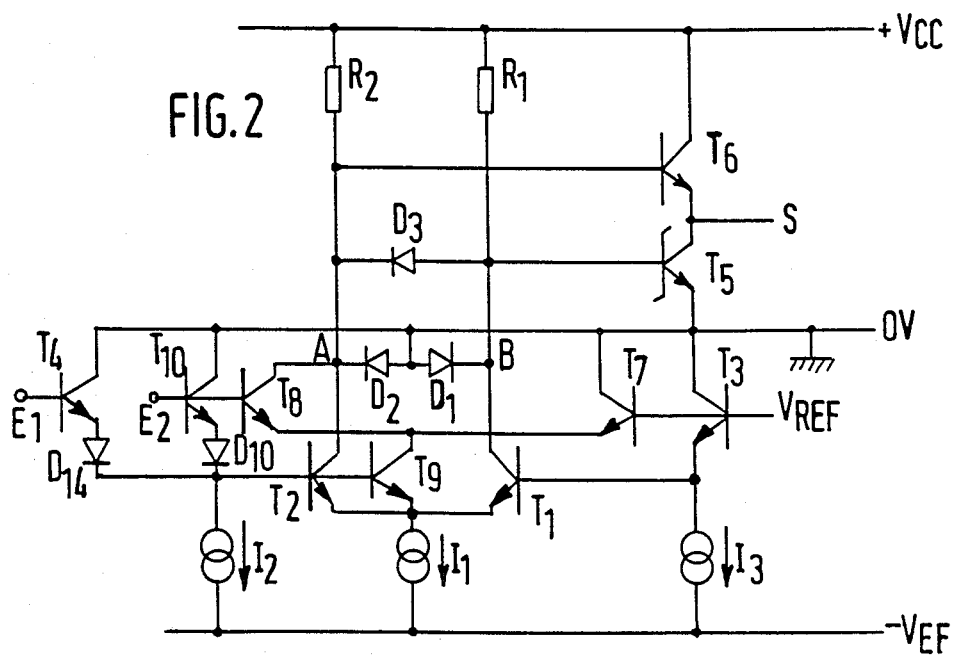
FIG. 2 shows a first embodiment of a converter circuit in accordance with the invention.

The circuit shown in FIG. 2 enables a third state of the circuit in which the output impedance is very high and in which the transistors $T_5$ and $T_6$ are simultaneously turned off, regardless of the signal applied to the input $E_1$. In order to achieve this, the converter circuit comprises additional components, that is to say the transistors $T_7$, $T_8$, $T_9$ and $T_{10}$, and the diode $D_3$. The anode of the diode $D_3$ is connected to the base of the transistor $T_5$ and its cathode is connected to the base of the transistor $T_6$. The emitters of the transistors $T_7$ and $T_8$ are coupled. The transistor $T_7$ has its base connected to that of the transistor $T_3$, thus receiving the reference voltage VREF, its collector being connected to ground OV. The collector of the transistor $T_8$ is connected to that of the transistor $T_2$ (point A) and its base is connected to that of the transistor $T_{10}$ whose collector is connected to ground OV, its emitter being connected to the base of the transistor $T_2$.

It is to be noted that if a diode $D_{14}$ is connected in series with the emitter of the transistor $T_4$, a diode $D_{10}$ will be connected in series with the emitter of the transistor $T_{10}$. The base of the transistors $T_8$ and $T_{10}$ receives a control signal $E_2$ which enables activation of the third state of the converter circuit when $E_2$ is high, as will appear from the following description.

Figure 3:
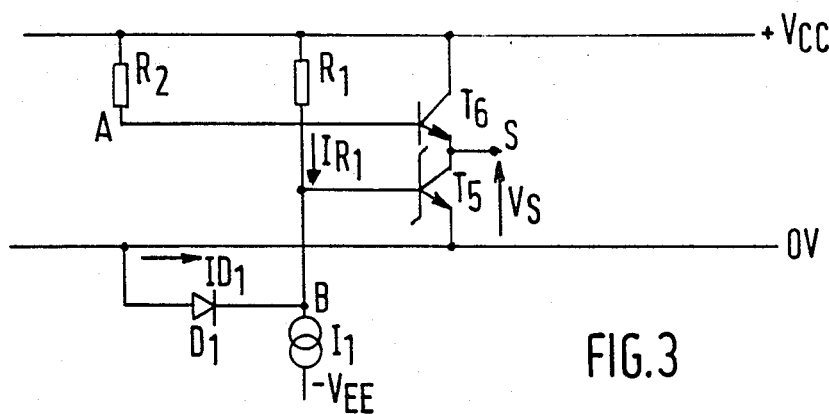
FIGS. 3, 4 and 5 show equivalent diagrams relating to the operation of the circuit shown in FIG. 2 in the three states which may occur on its output.

FIG. 3 relates to the first state in which $E_1$ and $E_2$ are low. Because the transistors $T_2$, $T_8$ and $T_9$ are turned off and the transistor $T_1$ is turned on, the current $I_1$ is distributed between the diode $D_1$ (current $ID_1$) and the resistor $R_1$ (current $IR_1$). The conductive diode $D_1$ fixes the potential of the point B to $-VD_1$ with respect to ground (OV), thus turning off the transistor $T_5$. No current whatsoever flows through $R_2$, because the transistors $T_2$ and $T_8$ are turned off and the diodes $D_2$ and $D_3$ are connected in the reverse direction. Consequently, the transistor $T_6$ is turned on with a low output impedance.

The operating condition can be written as:

$$I_1 \cong \frac{V_{cc} + VD_1}{R_1} \quad (1)$$

where $VD_1$ denotes the voltage across the terminals of the diode $D_1$.

Figure 4:
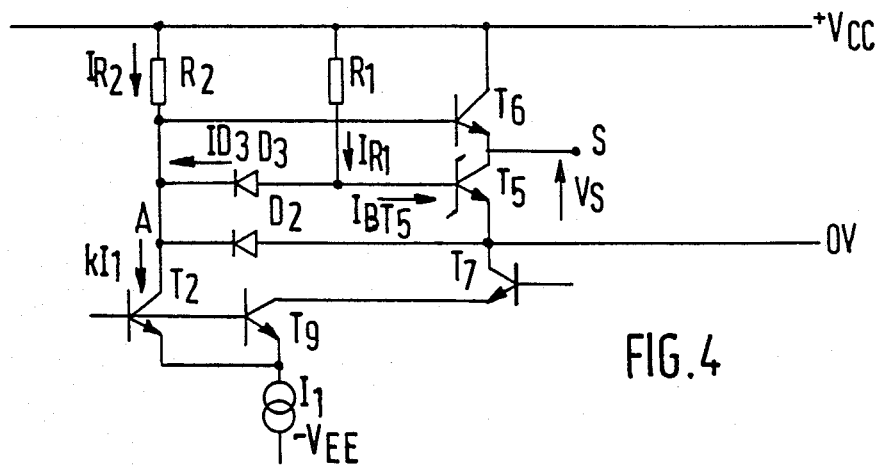

FIG. 4 relates to the second state in which $E_1$ is high and $E_2$ is low. Because the transistors $T_2$, $T_7$ and $T_9$ are turned on and the transistors $T_1$ and $T_8$ are turned off, the current $I_1$ is distributed between the transistors $T_2$ and $T_9$, the part of the current $I_1$ which flows through $T_9$ being applied to ground via the transistor $T_7$. Only the part $kI_1$ (where k is smaller than 1) which passes through the transistor $I_2$ is active. The circuit parameters are chosen so that no current whatsoever flows through the diode $D_2$. The transistor $T_5$ is turned on and:

$$ID_3 = IR_1 - IBT_5$$

where $ID_3$, $IR_1$ and $IBT_5$ denote the currents flowing through the diode $D_3$, the resistor $R_1$ and the base of the transistor $T_5$, respectively.

Therefore, the potential at the point A is:

$$VBET_5 - VD_3 \simeq OV$$

where $VBET_5$ denotes the base-emitter voltage of the transistor $T_5$ and $VD_3$ denotes the voltage across the terminals of the diode $D_3$. The base of the transistor $T_6$ carries substantially OV, so that it is turned off. Saturation of the transistor $T_5$, operating with a low collector-emitter voltage VCE, is prevented by a Schottky diode.

The operating equation of the circuit can thus be written in the form of a current condition:

$$\frac{V_{cc} - V_{BET5} + V_{D3}}{R_2} < kI_1 < \frac{V_{cc} - V_{BET5} + V_{D3}}{R_2} + \frac{V_{cc} - V_{BET5}}{R_1} \text{ or} \quad (2)$$

$$\frac{V_{cc}}{R_2} < kI_1 < \frac{V_{cc}}{R_2} + \frac{V_{cc} - V_{BET5}}{R_1}$$

Evidently, the factor k is always smaller than 1 and is determined by the ratio of the emitter surfaces $S_{ET2}$ and $S_{ET9}$ of the transistors $T_2$ and $T_9$:

$$k = \frac{S_{ET2}}{S_{ET2} + S_{ET9}}$$

Figure 5:
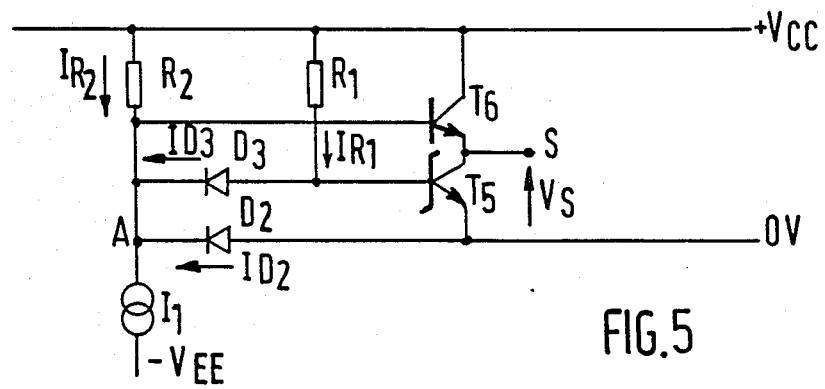

FIG. 5 relates to the third state in which the input $E_2$ is high, regardless of the state of the input $E_1$.

The transistors $T_2$, $T_8$ and $T_9$ are turned on and the transistors $T_1$ and $T_7$ are turned off.

The choice of a sufficiently large current $I_1$, that is to say larger than $$I_{R2} + I_{D3},$$

enables a current $I_{D2}$ to flow in the diode $D_2$ which biases the point A to a potential $-V_{D2}$ with respect to ground 0V.

Thus:

$$I_1 = I_{R2} + I_{D2} + I_{D3}.$$

The base of the transistor $T_6$ is connected to the potential $-V_{D2}$ so that this transistor is turned off. The potential of the base of the transistor $T_5$ is:

$$-V_{D2} + V_{D3} \approx 0V,$$

so that this transistor is also turned off. Therefore, $I_{D3} = I_{R1}$.

Because the transistors $T_5$ and $T_6$ are simultaneously turned off, the point S is equivalent to an open circuit (substantially infinite impedance) for $VS \geq 0V$, where VS denotes the voltage of the point S.

The operating equation can then be written as:

$$I_1 > I_{R2} + I_{D3} > \frac{V_{cc} + V_{D2}}{R_2} + \frac{V_{cc} + V_{D2} - V_{D3}}{R_1} \approx \quad (3)$$

$$\frac{V_{cc} + V_{D2}}{R_2} + \frac{V_{cc}}{R_1}$$

The set of operating equations of the circuit can thus be written as:

$$I_1 \geq \frac{V_{cc} + V_{D1}}{R_1} \quad (1)$$

$$\frac{V_{cc}}{R_2} < kI_1 < \frac{V_{cc}}{R_2} + \frac{V_{cc} - V_{BET5}}{R_1} \quad (2)$$

$$I_1 > \frac{V_{cc} + V_{D2}}{R_2} + \frac{V_{cc}}{R_1} \quad (3)$$

Because:

$$\frac{V_{cc} + V_{D2}}{R_2}$$

is virtually always larger than:

$$\frac{V_{D1}}{R_1},$$

the relation (1) is thus satisfied when the relation (3) is satisfied.

Comparison of the first member of the relation (2) and that of the relation (3) offers:

$$k > \frac{R_1 V_{cc}}{R_1(V_{cc} + V_{D2}) + V_{cc}R_2}$$

which can be simplified as $$k > \frac{R_1}{R_1 + R_2} \quad (4)$$

The operation of the circuit is ensured when the conditions (3) and (4) are simultaneously satisfied and if:

$$kI_1 < \frac{V_{cc}}{R_2} + \frac{V_{cc} - V_{BET5}}{R_1} \quad (2)'$$

Figure 6:
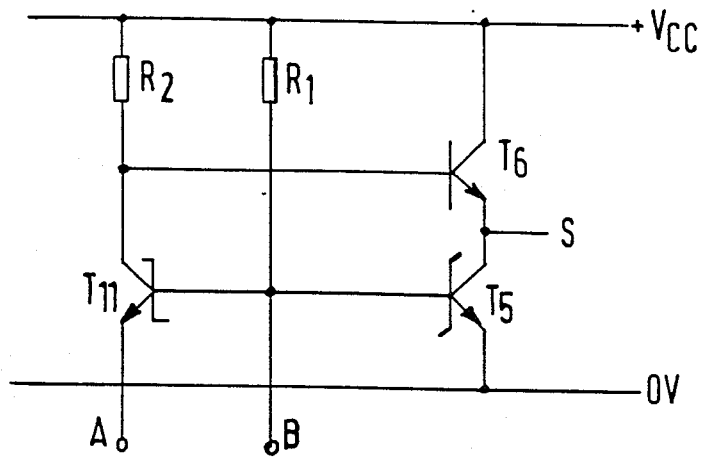
FIG. 6 shows a preferred embodiment in accordance with the invention.

In FIG. 6, a transistor $T_{11}$ which is preferably of the Schottky type and whose base is connected to that of the transistor $T_5$, its collector being connected to the base of the transistor $T_6$ whilst its emitter is connected to the collector (point A) of the transistor $T_2$, replaces the diode $D_3$.

In the first state, the transistor $T_{11}$ is turned off and thepoint A is isolated from the supply voltage Vcc, so that the diode $D_2$ and the transistors $T_8$ and $T_2$ need not sustain reverse voltages at the limit of the avalanche voltages of the junctions.

In the other two states, the transistor $T_{11}$ is turned on with a very low collector-emitter voltage (in the order of 200 mV) and its emitter-base diode performs the function of the diode $D_3$.

Figure 7:
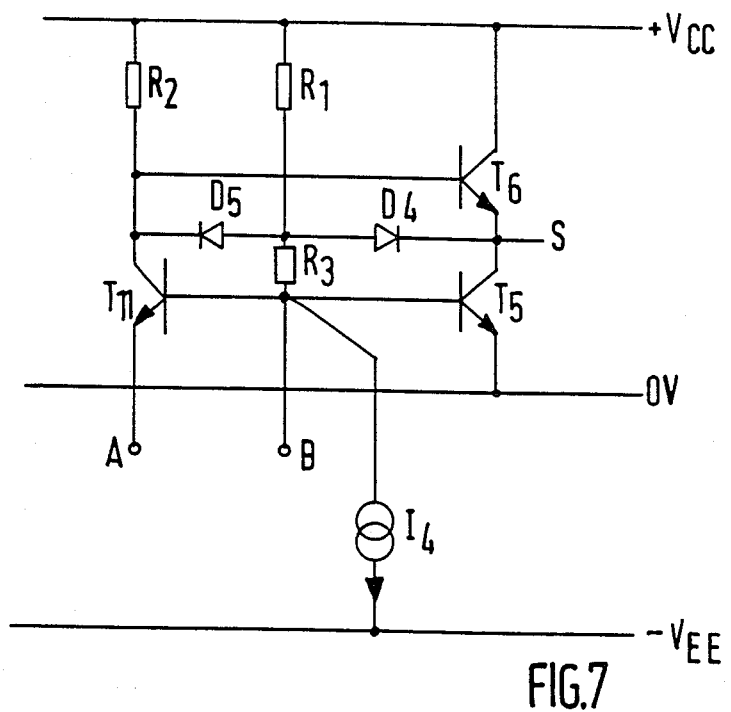
FIG. 7 shows an alternative for the above embodiment.

FIG. 7 shows an alternative version of FIG. 6 which utilizes bipolar transistors $T_5$ and $T_{11}$ which are not of the Schottky type and whose saturation is prevented by a resistor $R_3$ and two diodes $D_4$ and $D_5$. It is to be noted, however, that this alternative necessitates the presence of an auxiliary current source. The resistor $R_3$ is connected between the common junction of the bases of the transistors $T_5$ and $T_{11}$ (point B) and the common junction of the anodes of the diodes $D_3$ and $D_4$. The cathodes of the diodes $D_4$ and $D_5$ are connected to the collectors of the transistors $T_5$ and $T_{11}$, respectively. An auxiliary current source $I_4$ supplies a current of, for example 0.5 mA and is connected between the point B and the negative supply voltage source $-VEE$.

When one of the transistors $T_5$ and $T_{11}$ is turned on, its collector-emitter voltage VCE ($T_5$, $T_{11}$) amounts to:

$$V_{CE}(T_5, T_{11}) = T_{BE}(T_5, T_{11}) + R_3I_4 - V_D(D_4, D_5)$$
$$R_3I_4 V_{BE}(T_5, T_{11})$$

denoting the base-emitter voltage of the turned-on transistor $T_5$ or $T_{11}$ and $V_D(D_4, D_5)$ dnoting the voltage across the terminals of the conductive diode $D_4$ or $D_5$.

It is to be noted in particular that the output voltage in the low state, being very near to $R_3$, $I_4$, can thus be controlled and rendered intensitive to the variations of the parameters of the transistor $T_5$ which are caused notably by manufacturing tolerances.

What is claimed is:

1. A circuit for converting logic levels between logic of the type utilizing pairs of emitter-coupled transistors (ECL, CML) and logic of the transistor-transistor type (TTL), comprising a differential input state which includes at least one first transistor ($T_1$) and one second transistor ($T_2$) whose emitters are coupled, a principal current source ($I_1$) which is connected between said coupled emitters, and a negative supply voltage source, the collectors of said first and second transistors being connected to a positive supply voltage source by a first resistor ($R_1$) and a second resistor ($R_2$), respectively, the base of the first transistor being coupled to a reference voltage ($V_{REF}$) and the base of the second transistor being coupled to an input signal ($E_1$) whose level is to be translated, a first diode ($D_1$) and a second diode ($D_2$) whose anodes are connected to ground and whose cathodes are connected to the collector of the first transistor and the second transistor, respectively, and also comprising an output stage which includes a fifth transistor ($T_5$) and a sixth transistor ($T_6$) whose collector-emitter paths are connected in series, the emitter of the fifth transistor being connected to ground, its base being connected to the collector of the first transistor and its collector being connected to the emitter of the sixth transistor at a point which forms the output of converter circuit, the base of the sixth transistor being connected to the collector of the second transistor and its collector being connected to the positive supply voltage source, characterized in that in order to realize a third output state having a high output impedance, the converter circuit further comprises a seventh transistor ($T_7$) and an eighth transistor ($T_8$) whose emitters are coupled together and connected to the collector of a ninth transistor ($T_9$) whose base is connected to the base of the second transistor ($T_2$) and whose emitter is connected to the emitters of the first transistor ($T_1$) and the second transistor ($T_2$), the base of the seventh transistor ($T_7$) receiving said reference voltage and the collector of the seventh transistor ($T_7$) being connected to ground, the base of the eighth transistor ($T_8$) being connected to the base of a tenth transistor ($T_{10}$) which constitutes a selection input ($E_2$) for said third state, the collector and emitter of the tenth transistor being connected to ground and coupled to the base of the second transistor ($T_2$), respectively, the collector of the eighth transistor ($T_8$) being connected to the collector of the second transistor ($T_2$), and a third diode ($D_3$) whose anode is connected to the base of the fifth transistor ($T_5$) and whose cathode is connected to the collector of the second transistor ($T_2$).

2. A converter circuit as claimed in claim 1, characterized in that the differential input stage comprises a third transistor ($T_3$) whose collector is connected to ground, whose basereceives said reference voltage and whose emitter is connected to the base of the first transistor ($T_1$), and also comprises a fourth transistor ($T_4$) whose base directly receives said input signal, whose emitter is connected to the base of the second transistor ($T_2$), and whose collector is connected to ground, a first ($I_2$) and a second ($I_3$) auxiliary current source being connected to the emitters of the third transistor and the fourth transistor, respectively.

3. A converter circuit as claimed in claim 1 or 2, characterized in that said third diode is formed by the base-emitter diode of an eleventh transistor ($T_{11}$) whose base is connected to the base of the fifth transistor ($T_5$) and whose collector is connected to the base of the sixth transistor ($T_6$) so that the base of the sixth transistor ($T_6$) and the second resistor ($R_2$) are connected to the collector of the second transistor ($T_2$) via the collector-emitter path of the eleventh transistor ($T_{11}$).

4. A converter circuit as claimed in claim 3, characterized in that the fifth transistor ($T_5$) is a Schottky transistor.

5. A converter circuit as claimed in claim 4, taken together, characterized in that the eleventh transistor ($T_{11}$) is a Schottky transistor.

6. A converter circuit as claimed in claim 3, characterized in that it comprises a third resistor ($R_3$) which is connected in series between the collector of the first transistor ($T_1$) and the first resistor ($R_1$), and also comprises a fourth diode ($D_4$) and a fifth diode ($D_5$) whose anodes are interconnected at the common junction of the first resistor ($R_1$) and the third resistor ($R_3$), the cathode of the fourth diode ($D_4$) being connected to the output (S) of the converter circuit while the cathode of the fifth diode ($D_5$) is connected to the collector of the eleventh transistor ($T_{11}$), the converter circuit also comprising a third auxiliary current source ($I_4$) which is connected between the collector of the first transistor ($T_1$) and the negative supply voltage source, the product of the value of the third resistor ($R_3$) and the intensity of the third current source ($I_4$) being such that saturation of the fifth transistor ($T_5$) and the eleventh transistor ($T_{11}$) is avoided.

* * * * *